United States Patent
Arai

(10) Patent No.: US 9,300,506 B2
(45) Date of Patent: Mar. 29, 2016

(54) CLOCK SYNCHRONIZATION CIRCUIT AND SEMICONDUCTOR DEVICE

(71) Applicant: LAPIS SEMICONDUCTOR CO., LTD., Kanagawa (JP)

(72) Inventor: Kenji Arai, Kanagawa (JP)

(73) Assignee: LAPIS SEMICONDUCTOR CO., LTD, Kanagawa (JP)

( * ) Notice: Subject to any disclaimer, the term of this patent is extended or adjusted under 35 U.S.C. 154(b) by 0 days.

(21) Appl. No.: 14/592,054

(22) Filed: Jan. 8, 2015

(65) Prior Publication Data

US 2015/0124917 A1    May 7, 2015

Related U.S. Application Data

(63) Continuation of application No. 13/962,087, filed on Aug. 8, 2013, now Pat. No. 8,957,719.

(30) Foreign Application Priority Data

Aug. 9, 2012    (JP) .................................. 2012-177365

(51) Int. Cl.
*H04L 27/06* (2006.01)
*H03L 7/00* (2006.01)
*G06F 13/42* (2006.01)
*G06F 1/12* (2006.01)
*H03K 19/096* (2006.01)
(Continued)

(52) U.S. Cl.
CPC ................ *H04L 27/066* (2013.01); *G06F 1/12* (2013.01); *G06F 13/42* (2013.01); *H03K 3/35606* (2013.01); *H03K 3/356156* (2013.01); *H03K 19/0013* (2013.01); *H03K 19/096* (2013.01); *H03L 7/00* (2013.01); *H04L 7/00* (2013.01); *H03K 19/018521* (2013.01); *H04L 7/0008* (2013.01); *H04L 7/033* (2013.01)

(58) Field of Classification Search
CPC ... H01L 27/12; H01L 27/1214; H01L 27/092; H01L 27/0218; H03K 3/012; H03K 19/096; H03K 5/133
USPC .......................................... 327/202, 203, 212
See application file for complete search history.

(56) References Cited

U.S. PATENT DOCUMENTS 6,646,492 B2    11/2003    Park et al.
8,570,086 B2 *  10/2013    Hirairi .......................... 327/212
(Continued)

FOREIGN PATENT DOCUMENTS

JP    11-015783 A    1/1999

*Primary Examiner* — John Poos
(74) *Attorney, Agent, or Firm* — Kubotera & Associates, LLC

(57) ABSTRACT

A clock synchronization circuit is configured to capture an input data bit according to an input clock signal, and to synchronize and output the input data bit. The clock synchronization circuit includes a clock buffer for generating an internal clock signal according to the input clock signal and transmitting the internal clock signal to a clock line. The clock synchronization circuit further includes a D flip-flop for capturing and outputting the input data bit at an edge timing of the internal clock signal. The clock buffer includes an inverter core portion and an electric current suppressing portion. The inverter core portion is configured to generate the internal clock signal through alternately supplying an electric current to the clock line and drawing the electric current from the clock line according to the input clock signal. The electric current suppressing portion is configured to suppress an amount of the electric current.

3 Claims, 8 Drawing Sheets

| (51) | Int. Cl. | |
|---|---|---|
| | H04L 7/00 | (2006.01) |
| | H03K 3/356 | (2006.01) |
| | H03K 19/00 | (2006.01) |
| | H04L 7/033 | (2006.01) |
| | H03K 19/0185 | (2006.01) |

(56) References Cited

U.S. PATENT DOCUMENTS

2010/0134149 A1\* 6/2010 Bol et al. .................. 326/103
2012/0194246 A1 8/2012 Hirairi \* cited by examiner

CLOCK SYNCHRONIZATION CIRCUIT AND SEMICONDUCTOR DEVICE

CROSS-REFERENCE TO RELATED APPLICATIONS

This is a continuation application of a prior application Ser. No. 13/962,087, filed on Aug. 8, 2013, allowed.

BACKGROUND OF THE INVENTION AND RELATED ART STATEMENT

The present invention relates to a clock synchronization circuit and a semiconductor device having the clock synchronization circuit. More specifically, the present invention relates to a clock synchronization circuit for capturing data input thereto in synchronization with a clock signal and outputting the data, and a semiconductor device having the clock synchronization circuit.

In general, a digital signal processing device formed on a semiconductor chip includes a conventional clock synchronization circuit for synchronizing input data with a clock signal, and for transmitting the data to a processing circuit at a next stage. The conventional clock synchronization circuit may include a D flip-flop for capturing the data at a timing in synchronization with the clock signal and a clock buffer for supplying the clock signal supplied from an outside of the semiconductor chip to the D flip-flop (refer to Patent Reference).

Patent Reference: Japanese Patent Publication No. 11-15783

In the recent years, a finer semiconductor device process has become available. Further, a processing speed has increased, and a circuit size has become larger. With these trends, the number of the D flip-flops to be mounted on the semiconductor chip has increased. Accordingly, in the conventional clock synchronization circuit, power consumption has increased. Further, when the clock buffer and the D flip-flop are operated simultaneously, electromagnetic interference (EMI) tends to be generated more frequently due to an increase in a peak electric current.

In view of the problems described above, an object of the present invention is to provide a clock synchronization circuit and a semiconductor device capable of solving the problems of the conventional clock synchronization circuit. In the clock synchronization circuit and the semiconductor device of the present invention, it is possible to reduce power consumption and EMI.

Further objects and advantages of the invention will be apparent from the following description of the invention.

SUMMARY OF THE INVENTION

In order to attain the objects described above, according to a first aspect of the present invention, a clock synchronization circuit is configured to capture an input data bit according to an input clock signal, and to synchronize and output the input data bit. The clock synchronization circuit includes a clock buffer for generating an internal clock signal according to the input clock signal and transmitting the internal clock signal to a clock line. The clock synchronization circuit further includes a D flip-flop for capturing and outputting the input data bit at an edge timing of the internal clock signal supplied through the clock line.

According to the first aspect of the present invention, the clock buffer includes an inverter core portion and an electric current suppressing portion. The inverter core portion is configured to generate the internal clock signal through alternately supplying an electric current to the clock line and drawing the electric current from the clock line according to the input clock signal. The electric current suppressing portion is configured to suppress an amount of the electric current.

According to a second aspect of the present invention, a semiconductor device includes a clock synchronization circuit formed therein and configured to capture an input data bit according to an input clock signal, and to synchronize and output the input data bit. The clock synchronization circuit includes a clock buffer for generating an internal clock signal according to the input clock signal and transmitting the internal clock signal to a clock line. The clock synchronization circuit further includes a D flip-flop for capturing and outputting the input data bit at an edge timing of the internal clock signal supplied through the clock line.

According to the second aspect of the present invention, the clock buffer includes an inverter core portion and an electric current suppressing portion. The inverter core portion is configured to generate the internal clock signal through alternately supplying an electric current to the clock line and drawing the electric current from the clock line according to the input clock signal. The electric current suppressing portion is configured to suppress an amount of the electric current.

As described above, the clock buffer includes the inverter core portion and the electric current suppressing portion. The inverter core portion is configured to generate the internal clock signal through alternately supplying an electric current to the clock line and drawing the electric current from the clock line according to the input clock signal. The electric current suppressing portion is configured to suppress the amount of the electric current.

According to the present invention, it is possible to reduce the amount of the electric current and a peak level of the electric current flowing through the clock buffer at each of the edge timing of the input clock signal. Accordingly, it is possible to reduce power consumption and EMI.

DETAILED DESCRIPTION OF PREFERRED EMBODIMENTS

Hereunder, preferred embodiments of the present invention will be explained with reference to the accompanying drawings.

First Embodiment

Figure 1:
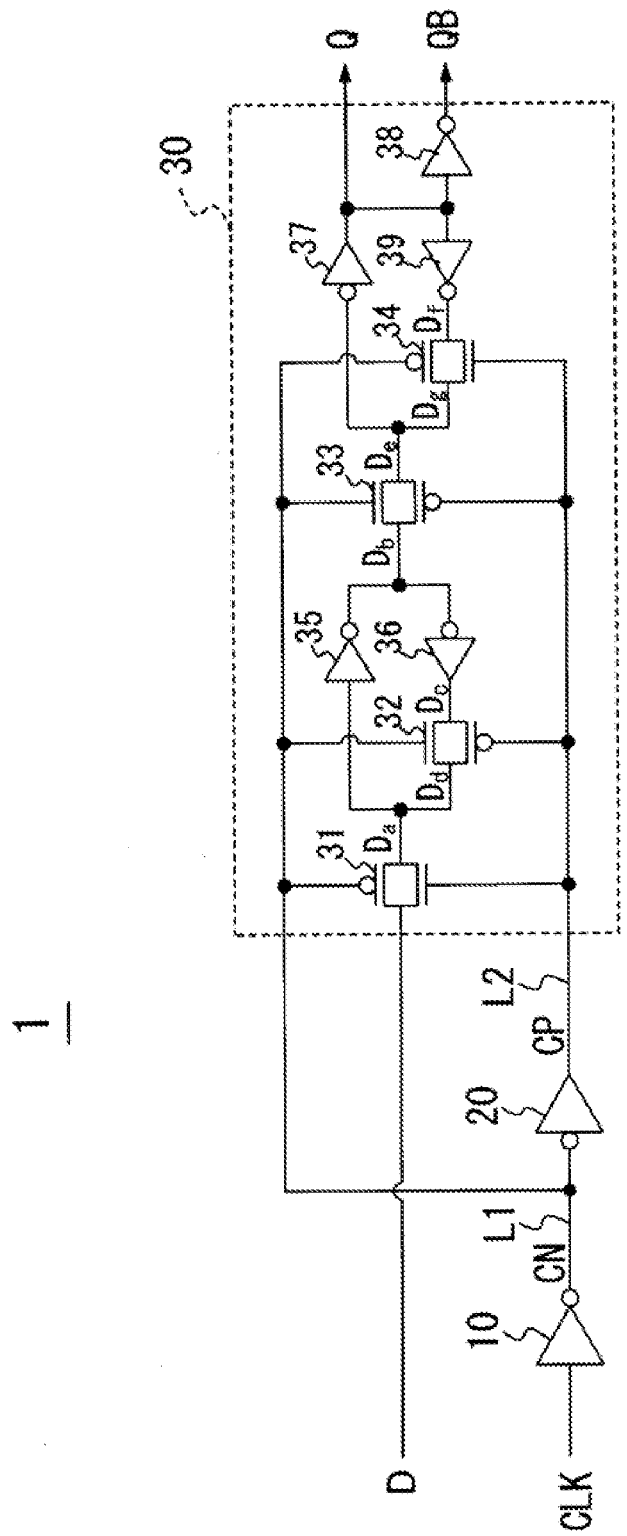
FIG. 1 is a circuit diagram showing a configuration of a clock synchronization circuit according to a first embodiment of the present invention.

A first embodiment of the present invention will be explained. FIG. 1 is a circuit diagram showing a configuration of a clock synchronization circuit 1 according to the first embodiment of the present invention.

As shown in FIG. 1, the clock synchronization circuit 1 includes clock inverters 10 and 20 as clock buffers and a DFF portion 30 as a D flip-flop (referred to as DFF) of an edge trigger type.

Figure 2:
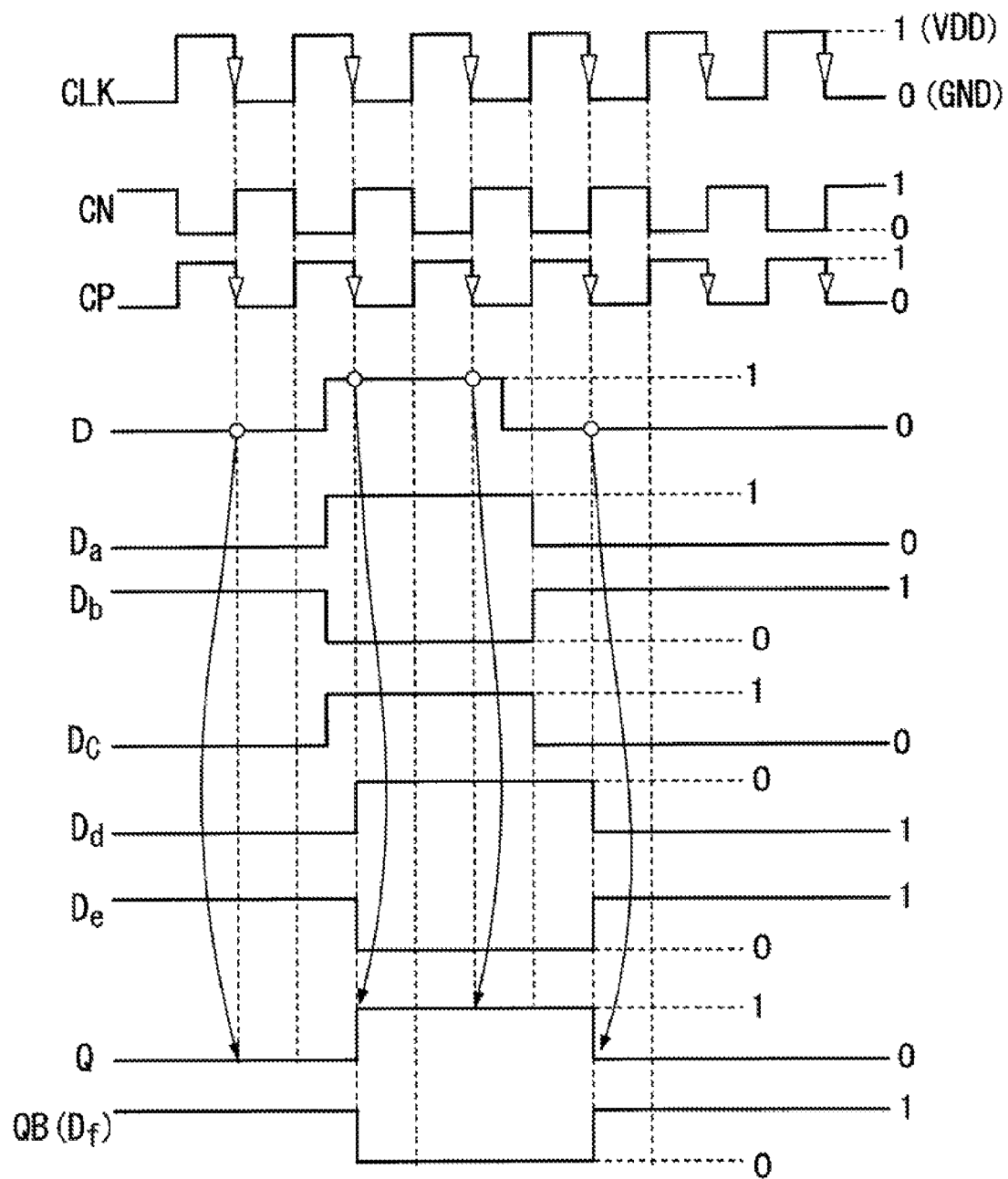
FIG. 2 is a time chart showing an internal operation of a D flip-flop portion of the clock synchronization circuit according to the first embodiment of the present invention.

FIG. 2 is a time chart showing an internal operation of the DFF portion 30 of the clock synchronization circuit 1 according to the first embodiment of the present invention.

In the first embodiment, a clock signal CLK is input into the clock inverter 10. The clock inverter 10 is configured to invert a logic level of the clock signal CLK thus input to generate an internal clock signal CN as shown in FIG. 2. Then, the clock inverter 10 is configured to supply the internal clock signal CN to the clock inverter 20 and the DFF portion 30 through a clock line L1. As shown in FIG. 2, a voltage of the clock signal CLK is alternately changed between a power source voltage VDD and a ground voltage GND. Further, the clock signal CLK has the logic level "1" during a period of the power source voltage VDD, and the logic level "0" during a period of the ground voltage GND.

As shown in FIG. 2, the clock inverter 20 is configured to invert a logic level of the internal clock signal CN to generate an internal clock signal CP. Then, the clock inverter 20 is configured to supply the internal clock signal CP to the DFF portion 30 through a clock line L2.

In the first embodiment, the DFF portion 30 is configured to capture an input data bit D at an edge timing of a clock pulse of each of the internal clock signals CN and CP supplied from each of the clock inverters 10 and 20, respectively. Then, the DFF portion 30 is configured to output the input data bit D as a synchronization data bit Q. At the same time when the DFF portion 30 outputs the synchronization data bit Q, the DFF portion 30 is configured to output an inverted synchronization data bit QB having a logic level inverted from that of the synchronization data bit Q.

As shown in FIG. 1, the DFF portion 30 includes transmission gates (referred to as TG) 31 to 34 and inverters 35 to 39. Each of the TGs 31 to 34 is formed of a p-channel MOS (Metal Oxide Semiconductor) type transistor and an n-channel MOS type transistor connected in parallel. In other words, the DFF portion 30 includes a first latch portion formed of the TG 31, the TG 32, the inverter 35, and the inverter 36, and a second latch portion formed of the TG 33, the TG 34, the inverter 37, the inverter 38, and the inverter 39.

In the first embodiment, in the first latch portion, the internal clock signal CN is supplied to a gate terminal of the TG 31 on a p-channel side thereof and the internal clock signal CP is supplied to a gate terminal of the TG 31 on an n-channel side thereof. As shown in FIG. 2, the TG 31 is configured to capture a value of the input data bit D only when the internal clock signal CP has the logic level "1" and the internal clock signal CN has the logic level "0". Then, the TG 31 is configured to supply the input data bit D as a data bit Da to the inverter 35. Then, the inverter 35 is configured to supply the data bit Da or an inverted data bit Db having the logic level inverted from that of a data bit Dd (described later) to the TG 33 and the inverter 36. Then, the inverter 36 is configured to supply a data bit Dc having the logic level inverted from that of the inverted data bit Db to the TG 32 as shown in FIG. 2.

In the first embodiment, in the first latch portion, the internal clock signal CN is supplied to a gate terminal of the TG 32 on the n-channel side thereof and the internal clock signal CP is supplied to a gate terminal of the TG 32 on the p-channel side thereof. The TG 32 is configured to capture a value of the input data bit Dc only when the internal clock signal CP has the logic level "0" and the internal clock signal CN has the logic level "1". Then, the TG 32 is configured to supply the data bit Dc as the data bit Dd to the inverter 35.

In the first embodiment, with the configuration described above, when the internal clock signal CP has the logic level "1", the first latch portion captures the input data bit D and supplies the inverted data bit Db having the logic level inverted from that of the input data bit D to the second latch portion. Further, when the internal clock signal CP has the logic level "0", the first latch portion maintains the logic level of the inverted data bit Db and supplies the inverted data bit Db to the second latch portion.

In the first embodiment, in the second latch portion, the internal clock signal CN is supplied to a gate terminal of the TG 33 on the p-channel side thereof and the internal clock signal CP is supplied to a gate terminal of the TG 33 on the n-channel side thereof. As shown in FIG. 2, the TG 33 is configured to capture a value of the inverted data bit Db supplied from the first latch portion only when the internal clock signal CN has the logic level "1" and the internal clock signal CP has the logic level "0". Then, the TG 31 is configured to supply the input data bit D as a data bit Da to the inverter 35.

In the first embodiment, in the second latch portion, the inverter 35 is configured to output and supply a synchronization data bit Q having the logic level inverted from that of the data bit De to the inverter 38 and the inverter 38 as shown in FIG. 2. Then, the inverter 38 is configured to output an inverted synchronization data bit QB having the logic level inverted from that of the synchronization data bit Q as shown in FIG. 2. Further, the inverter 38 is configured to output an inverted data bit Df having the logic level inverted from that of the synchronization data bit Q to TG 34.

In the first embodiment, in the second latch portion, the internal clock signal CP is supplied to a gate terminal of the TG 34 on the n-channel side thereof and the internal clock signal CN is supplied to a gate terminal of the TG 34 on the p-channel side thereof. The TG 32 is configured to capture a value of the inverted data bit Df only when the internal clock signal CP has the logic level "1" and the internal clock signal CN has the logic level "0". Then, the TG 32 is configured to supply the inverted data bit Df as the data bit De to the inverter 37.

In the first embodiment, with the configuration described above, when the internal clock signal CP has the logic level "0", the second latch portion captures the inverted data bit Db supplied from the first latch portion and outputs the synchronization data bit Q having the logic level inverted from that of the inverted data bit Db. Further, when the internal clock signal CP has the logic level "1", the second latch portion maintains the logic level of the synchronization data bit Q and outputs the synchronization data bit Q. Further, the second latch portion outputs the inverted synchronization data bit QB having the logic level inverted from that of the synchronization data bit Q.

Accordingly, as described above, the DFF portion 30 formed of the first latch portion and the second latch portion captures and synchronizes the input data bit D at the rising edge timing of the clock pulse of the internal clock signal CP as shown in FIG. 2. Then, the DFF portion 30 outputs the inverted synchronization data bit QB and the synchronization data bit Q. It should be noted that the clock inverter 10 and the clock inverter 20 shown in FIG. 1 have an electric current suppressing function of suppressing a peak electric current instantly flowing therein at the level transition in the clock signal thus input.

Figure 3:
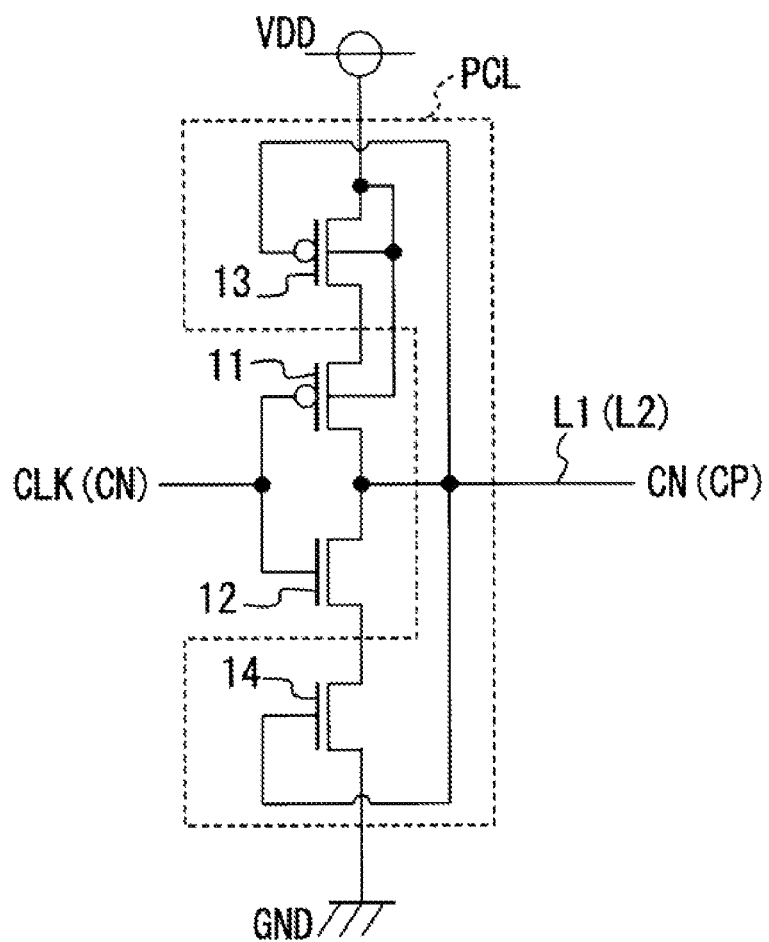
FIG. 3 is a circuit diagram showing a configuration of a clock inverter of the clock synchronization circuit according to the first embodiment of the present invention.

FIG. 3 is a circuit diagram showing a configuration of the clock inverter 10 (the clock inverter 20) of the clock synchronization circuit 1 according to the first embodiment of the present invention.

As shown in FIG. 3, the clock inverter 10 has the internal configuration identical to that of the clock inverter 20. More specifically, the clock inverter 10 includes an inverter core portion formed of a p-channel MOS type transistor 11 and an n-channel MOS type transistor 12, and an electric current suppressing portion PCL formed of a p-channel MOS type transistor 13 and an n-channel MOS type transistor 14.

In the first embodiment, drain terminals of the p-channel MOS type transistor 11 and the n-channel MOS type transistor 12 of the clock inverter 10 (the clock inverter 20) are connected to the clock line L1 (the clock line L2). Further, the clock signal CLK (the internal clock signal CN) is supplied to gate terminals of the p-channel MOS type transistor 11 and the n-channel MOS type transistor 12. A source terminal of the p-channel MOS type transistor 11 is connected to a drain terminal of the p-channel MOS type transistor 13. The power source voltage VDD is applied to a source terminal of the p-channel MOS type transistor 13, and a gate terminal of the p-channel MOS type transistor 13 is connected to the clock line L1 (the clock line L2).

Further, the power source voltage VDD is applied to a back gate of each of the p-channel MOS type transistor 11 and the p-channel MOS type transistor 13. A source terminal of the n-channel MOS type transistor 12 is connected to a drain terminal of the n-channel MOS type transistor 14. The ground voltage GND is applied to a source terminal of the re-channel MOS type transistor 14, and a gate terminal of the n-channel MOS type transistor 14 is connected to the clock line L1 (the clock line L2).

An internal operation of the clock inverter 10 and the clock inverter 20 will be explained next with reference to the internal operation of the clock inverter 10.

First, when the signal level of the clock signal CLK is changed, the inverter core portion starts the inversion operation of the signal level.

For example, just before the clock signal CLK is transited from the state of the logic level "1" to the state of the logic level "0", the voltage on the clock line L1 is a voltage VIL (described later) corresponding to the logic level "0" despite that the p-channel MOS type transistor 11 is in an off state. Accordingly, at this moment, the p-channel MOS type transistor 13 is in an on state. As a result, the power source voltage VDD is applied to the source terminal of the p-channel MOS type transistor 11 through the p-channel MOS type transistor 13. When the clock signal CLK starts transiting from the state of the logic level "1" to the state of the logic level "0", the p-channel MOS type transistor 11 is transited to the on state, so that the electric current flows to the clock line L1 through the p-channel MOS type transistor 13 and the p-channel MOS type transistor 11. Accordingly, the clock line L1 is charged with the electric current, and the voltage on the clock line L1 increases as the clock line L1 being charged.

Then, when the voltage on the clock line L1 exceeds a threshold voltage Vtp of the p-channel MOS type transistor, the p-channel MOS type transistor 13 is transited to the off state, so that the electric current stops flowing into the clock line L1. After the electric current stops flowing into the clock line L1, the voltage on the clock line L1 is maintained at a voltage level obtained by subtracting the threshold voltage Vtp from the power source voltage VDD. At this moment, the voltage level is the voltage VIH corresponding to the logic level "1" (that is, VIH=VDD−Vtp).

Accordingly, when the clock signal CLK is transited from the state of the logic level "1" to the state of the logic level "0", the voltage on the clock line L1 is transited from the voltage VIL corresponding to the logic level "0" to the voltage VIH corresponding to the logic level "1" (that is, VIH=VDD−Vtp), thereby completing the inversion operation.

On the other hand, just before the clock signal CLK is transited from the state of the logic level "0" to the state of the logic level "1", the voltage on the clock line L1 is the voltage VIH (that is, VIH=VDD−Vtp) corresponding to the logic level "1" despite that the n-channel MOS type transistor 12 is in the off state. Accordingly, at this moment, the n-channel MOS type transistor 14 is in the on state. As a result, the ground voltage GND is applied to the source terminal of the n-channel MOS type transistor 12 through the n-channel MOS type transistor 14. When the clock signal CLK starts transiting from the state of the logic level "0" to the state of the logic level "1", the re-channel MOS type transistor 12 is transited to the on state, so that the electric current is drawn from the clock line L1 to the n-channel MOS type transistor 12 and the n-channel MOS type transistor 14. Accordingly, the clock line L1 is discharged, and the voltage on the clock line L1 decreases as the clock line L1 being discharged.

Then, when the voltage on the clock line L1 becomes below a threshold voltage Vtn of the n-channel MOS type transistor, the n-channel MOS type transistor 14 is transited to the off state, so that the electric current stops being drawn from the clock line L1. After the electric current stops being drawn from the clock line L1, the voltage on the clock line L1 is maintained at the threshold voltage Vtn. At this moment, the voltage level is the voltage VIL corresponding to the logic level "0" (that is, VIL=Vtn).

Accordingly, when the clock signal CLK is transited from the state of the logic level "0" to the state of the logic level "1", the voltage on the clock line L1 is transited from the voltage VIH corresponding to the logic level "1" to the voltage VIL corresponding to the logic level "0" (that is, VIL=Vtn), thereby completing the inversion operation.

Figure 4:
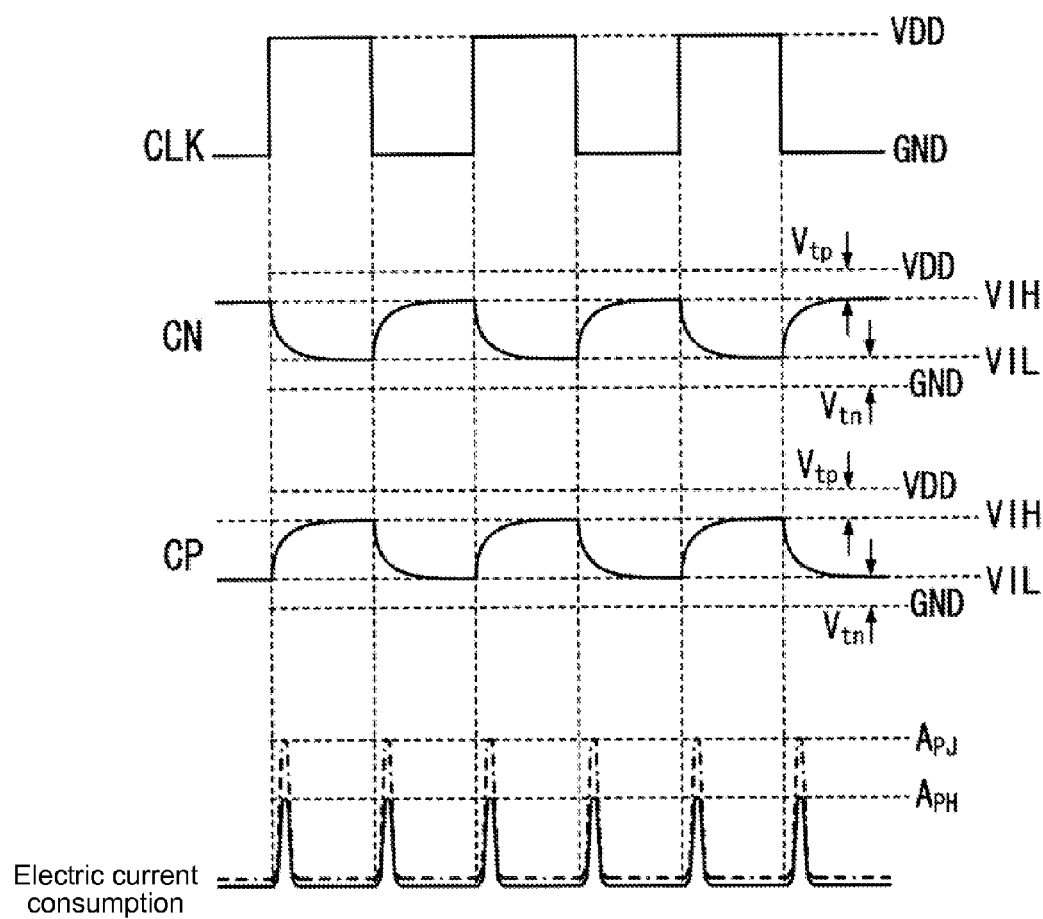
FIG. 4 is a time chart showing an internal clock signal generated with the clock inverter and electric current consumption of the clock synchronization circuit according to the first embodiment of the present invention.

FIG. 4 is a time chart showing the internal clock signal CN (CP) generated with the clock inverter 10 (20) and electric current consumption of the clock synchronization circuit 1 according to the first embodiment of the present invention As shown in FIG. 4, in the configuration shown in FIG. 3, the internal clock signal CN (the internal clock signal CP) is generated according to the cycle of the clock signal CLK, and the internal clock signal CN (the internal clock signal CP) has the voltage changing between the voltage Vtn and the voltage (VDD−Vtp). Further, the internal clock signal CN (the internal clock signal CP) has the amplitude smaller than the amplitude of the clock signal CLK that has the voltage changes between the power source voltage VDD and the ground voltage GND. Accordingly, as opposed to the inversion operation operating with the same amplitude as that of the clock signal CLK, the charging period relative to the clock line L1 (the clock line L2) is shortened, thereby decreasing the electric current consumed during the charging.

As shown in FIG. 4, the peak value APH of the electric current occurs at the start point of the inversion operation of the clock inverter 20 (the DFF portion 30), that is, each edge timing of the clock signal CLK. Further, the peak value APH of the electric current becomes smaller than the peak value APJ of the electric current in the inversion operation operating with the same amplitude as that of the clock signal CLK.

As described above, in the first embodiment, the clock inverter 10 (the clock inverter 20) having the configuration shown in FIG. 3 is configured to generate the internal clock signal CN (the internal clock signal CP) to be supplied to the DFF portion 30 at the p-channel MOS type transistor 11 (the n-channel MOS type transistor 12) thereof through alternately flowing and drawing the electric current into and from the clock line L1 (the clock line L2) according to the clock signal CLK.

In the first embodiment, the electric current suppressing portion PCL disposed in the clock inverter 10 (the clock inverter 20) is configured to forcibly stop flowing and drawing the electric current into and from the clock line L1 (the clock line L2) according to the voltage on the clock line L1 (the clock line L2). More specifically, when the voltage on the clock line L1 (the clock line L2) exceeds the first threshold value (VDD–Vtp), the electric current suppressing portion PCL stops flowing the electric current into the clock line L1 (the clock line L2). On the other hand, when the voltage on the clock line L1 (the clock line L2) becomes below the second threshold value (Vtn) smaller than the first threshold value (VDD–Vtp), the electric current suppressing portion PCL stops drawing the electric current from the clock line L1 (the clock line L2). Through the operation, the electric current suppressing portion PCL is configured to suppress the amount of the electric current to be flown into or drawn from the clock line L1 (the clock line L2) with the p-channel MOS type transistor 11 (the n-channel MOS type transistor 12).

Second Embodiment

A second embodiment of the present invention will be explained next. In the first embodiment, the electric current suppressing portion PCL shown in FIG. 3 is configured to suppress the electric current through stopping the flowing and drawing of the electric current into and from the clock line L1 (the clock line L2). Accordingly, it is possible to reduce the amount and the peak value of the electric current flowing in the clock inverter 10 (the clock inverter 20) at the edge timing of the clock signal CLK. As a result, it is possible to reduce the power consumption and EMI. Alternatively, in the second embodiment, it is configured to reduce the amount of the flowing and drawing of the electric current per unit time.

Figure 5:
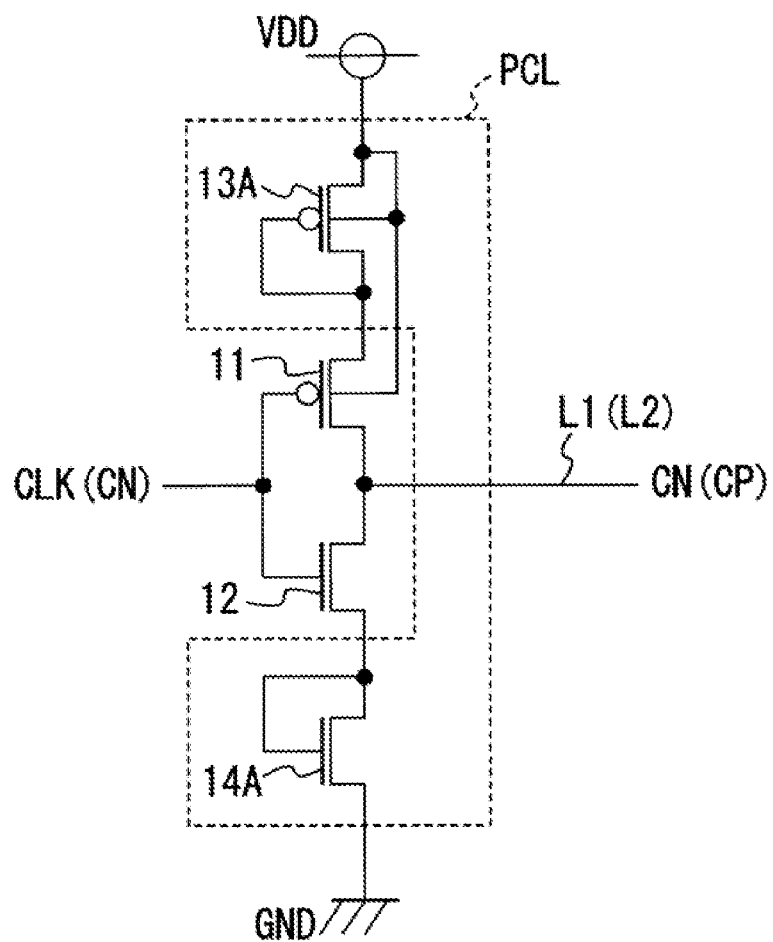
FIG. 5 is a circuit diagram showing a configuration of a clock inverter of a clock synchronization circuit according to a second embodiment of the present invention.

FIG. 5 is a circuit diagram showing a configuration of the clock inverter 10 (20) of the clock synchronization circuit according to the second embodiment of the present invention.

As shown in FIG. 5, instead of the p-channel MOS type transistor 13 and the n-channel MOS type transistor 14 of the electric current suppressing portion PCL, the electric current suppressing portion PCL is formed of a p-channel MOS type transistor 13A and an n-channel MOS type transistor 14A. Other components in the second embodiment are similar to those in the first embodiment.

More specifically, as shown in FIG. 5, the power source voltage VDD is applied to a source terminal of the p-channel MOS type transistor 13A, and a gate terminal and a drain terminal of the p-channel MOS type transistor 13A are connected to the source terminal of the p-channel MOS type transistor 11. Further, the ground voltage GND is applied to a source terminal of the n-channel MOS type transistor 14A, and a gate terminal and a drain terminal of the re-channel MOS type transistor 14A are connected to the source terminal of the n-channel MOS type transistor 12. Accordingly, when the p-channel MOS type transistor 11 and the n-channel MOS type transistor 12 become the on state, the p-channel MOS type transistor 13A and the n-channel MOS type transistor 14A are configured to reduce an increment rate of the flowing and drawing of the electric current into and from the clock line L1 (the clock line L2).

Accordingly, similar to the configuration shown in FIG. 3, with the configuration shown in FIG. 5, the electric current suppressing portion PCL is configured to suppress the amount of the electric current to be flown and drawn into and from the clock line L1 (the clock line L2) with the p-channel MOS type transistor 11 (the n-channel MOS type transistor 12). As a result, it is possible to reduce the amount and the peak value of the electric current flowing in the clock inverter 10 (the clock inverter 20) at the edge timing of the clock signal CLK, thereby reducing the power consumption and EMI.

Third Embodiment

A third embodiment of the present invention will be explained next. When the clock synchronization circuit 1 described above is installed in a data processing system, there is a period of time during a data processing process when the clock synchronization circuit 1 is in a non-operation state, that is, the clock synchronization circuit 1 is not operating to capture the data. In the non-operation state, the input data bit D does not change in the clock synchronization circuit 1, thereby reducing the power consumption. However, in an actual case, the electric current may leak through the p-channel MOS type transistor 11 and the n-channel MOS type transistor 12, especially, the p-channel MOS type transistor 11, of the clock inverter 10 and the clock inverter 20.

Figure 6:
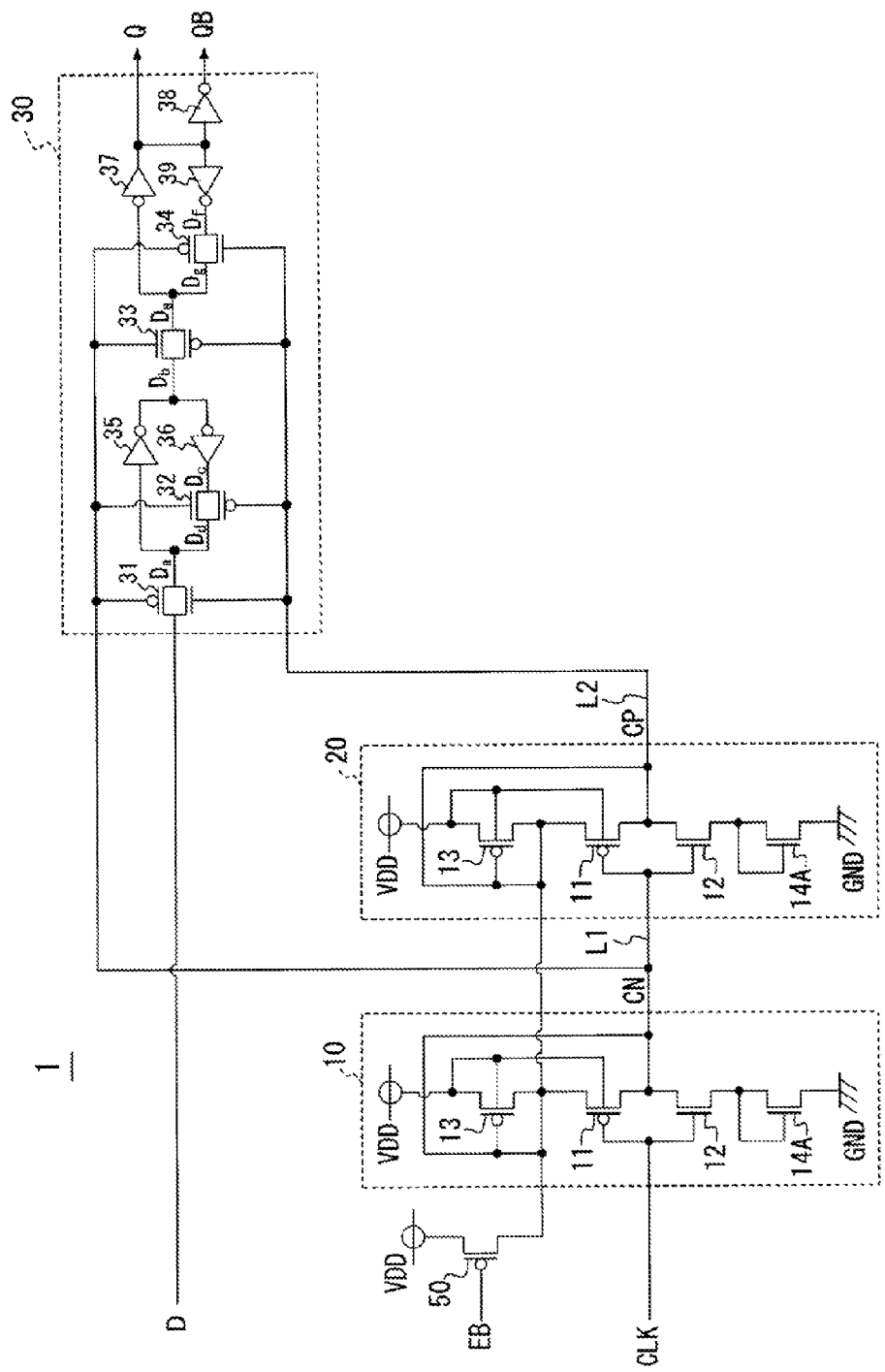
FIG. 6 is a circuit diagram showing a configuration of a clock synchronization circuit according to a third embodiment of the present invention.

In the third embodiment, the clock synchronization circuit 1 is configured to reduce the leak of the electric current. FIG. 6 is a circuit diagram showing a configuration of the clock synchronization circuit 1 according to the third embodiment of the present invention.

As shown in FIG. 6, the clock synchronization circuit 1 includes the clock inverter 10 and the clock inverter 20 having the configuration shown in FIG. 3 except the re-channel MOS type transistor 14A shown in FIG. 5 instead of the n-channel MOS type transistor 14 shown in FIG. 3. Further, the clock synchronization circuit 1 includes a p-channel MOS type transistor 50. Other components in the third embodiment are similar to those in the first and second embodiments.

More specifically, as shown in FIG. 6, the power source voltage VDD is applied to a source terminal of the p-channel MOS type transistor 50, and a drain terminal of the p-channel MOS type transistor 50 is connected to the gate terminal and the drain terminal of the p-channel MOS type transistor 13 in each of the clock inverter 10 and the clock inverter 20. Further, a disable signal EB is applied to a gate terminal of the p-channel MOS type transistor 50. The disable signal EB has the logic level "1" when the clock synchronization circuit 1 is operating to capture the data, that is, in the normal operation state. The disable signal EB has the logic level "0" when the clock synchronization circuit 1 is not operating to capture the data, that is, in the non-operation state.

Fourth Embodiment

Figure 7:
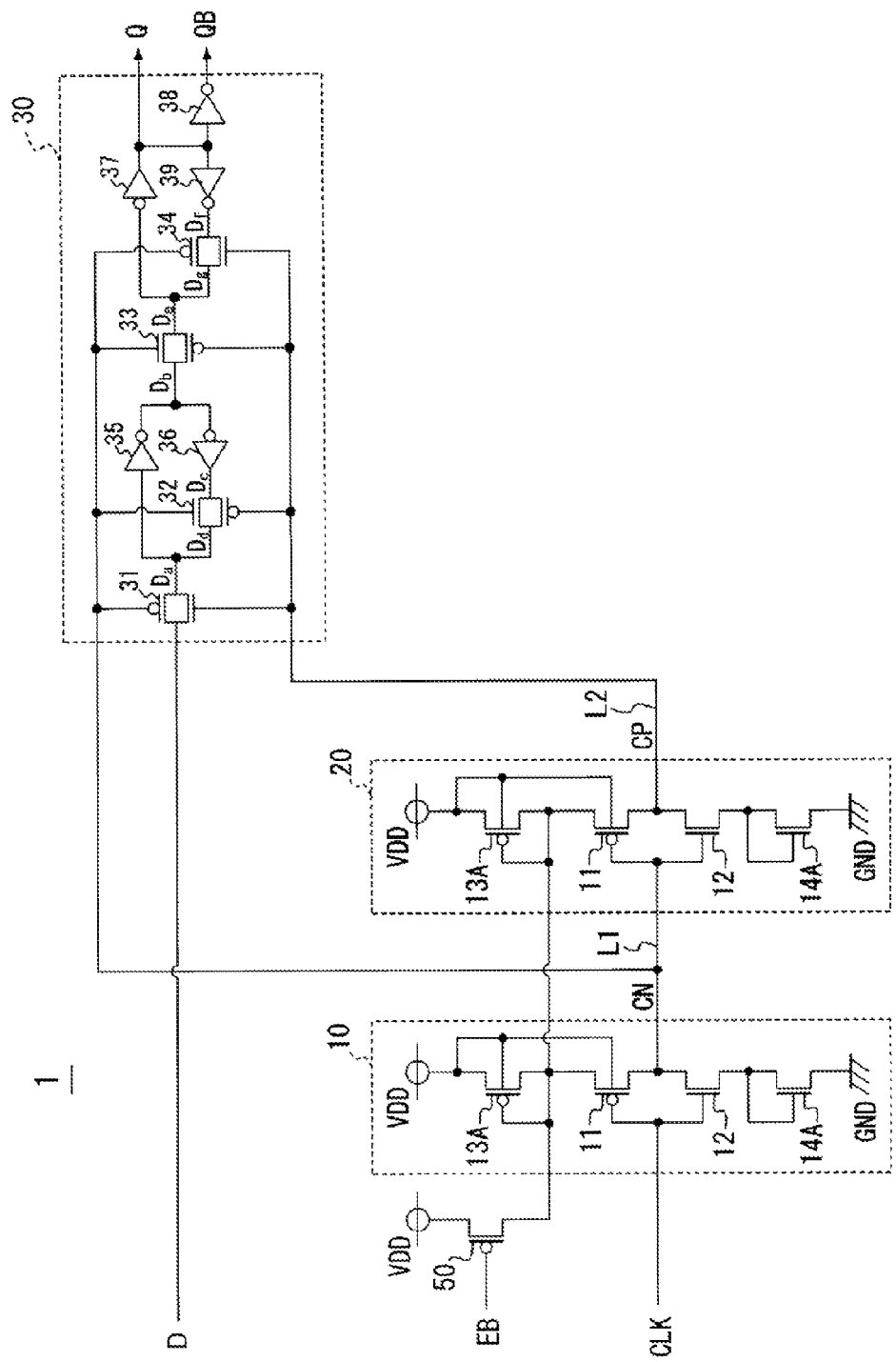
FIG. 7 is a circuit diagram showing a configuration of a clock synchronization circuit according to a fourth embodiment of the present invention.

A fourth embodiment of the present invention will be explained next. Similar to the third embodiment, in the third embodiment, the clock synchronization circuit 1 is configured to reduce the leak of the electric current. FIG. 7 is a circuit diagram showing a configuration of the clock synchronization circuit 1 according to the fourth embodiment of the present invention.

As shown in FIG. 7, the clock synchronization circuit 1 includes the clock inverter 10 and the clock inverter 20 having the configuration shown in FIG. 5 except the re-channel MOS type transistor 14A shown in FIG. 5 instead of the n-channel MOS type transistor 14 shown in FIG. 3. Further, the clock synchronization circuit 1 includes the p-channel MOS type transistor 50. Other components in the third embodiment are similar to those in the first and second embodiments.

More specifically, as shown in FIG. 7, the power source voltage VDD is applied to the source terminal of the p-channel MOS type transistor 50, and the drain terminal of the p-channel MOS type transistor 50 is connected to the gate terminal and the drain terminal of the p-channel MOS type transistor 13 in each of the clock inverter 10 and the clock inverter 20. Further, the disable signal EB is applied to a gate terminal of the p-channel MOS type transistor 50.

In the third embodiment and the fourth embodiment, when the clock synchronization circuit 1 is in the normal operation state, the disable signal EB with the logic level "1" is supplied to the clock synchronization circuit 1. When the disable signal EB with the logic level "1" is supplied to the clock synchronization circuit 1, the p-channel MOS type transistor 50 becomes the off state. Accordingly, the clock inverter 10 and the clock inverter 20 become equivalent to those shown in FIGS. 3 and 5.

On the other hand, when the clock synchronization circuit 1 is in the non-operation state, the disable signal EB with the logic level "0" is supplied to the clock synchronization circuit 1. When the disable signal EB with the logic level "0" is supplied to the clock synchronization circuit 1, the p-channel MOS type transistor 50 becomes the on state. As a result, the power source voltage VDD is applied to the gate terminal of the p-channel MOS type transistor 13 or the p-channel MOS type transistor 13A of the clock inverter 10 (the clock inverter 20), so that the p-channel MOS type transistor 13 or the p-channel MOS type transistor 13A remains the off state. Accordingly, the power source voltage VDD is not applied to the p-channel MOS type transistor 11, thereby reducing the leak current from the p-channel MOS type transistor 11.

As described above, in the third embodiment and the fourth embodiment, when the clock synchronization circuit 1 is in the non-operation state, it is possible to reduce the leak current, thereby reducing the power consumption.

Fifth Embodiment

A fifth embodiment of the present invention will be explained next. Similar to the third embodiment and the fourth embodiment, in the fifth embodiment, the clock synchronization circuit 1 is configured to reduce the leak current when the clock synchronization circuit 1 is in the non-operation state.

Figure 8:
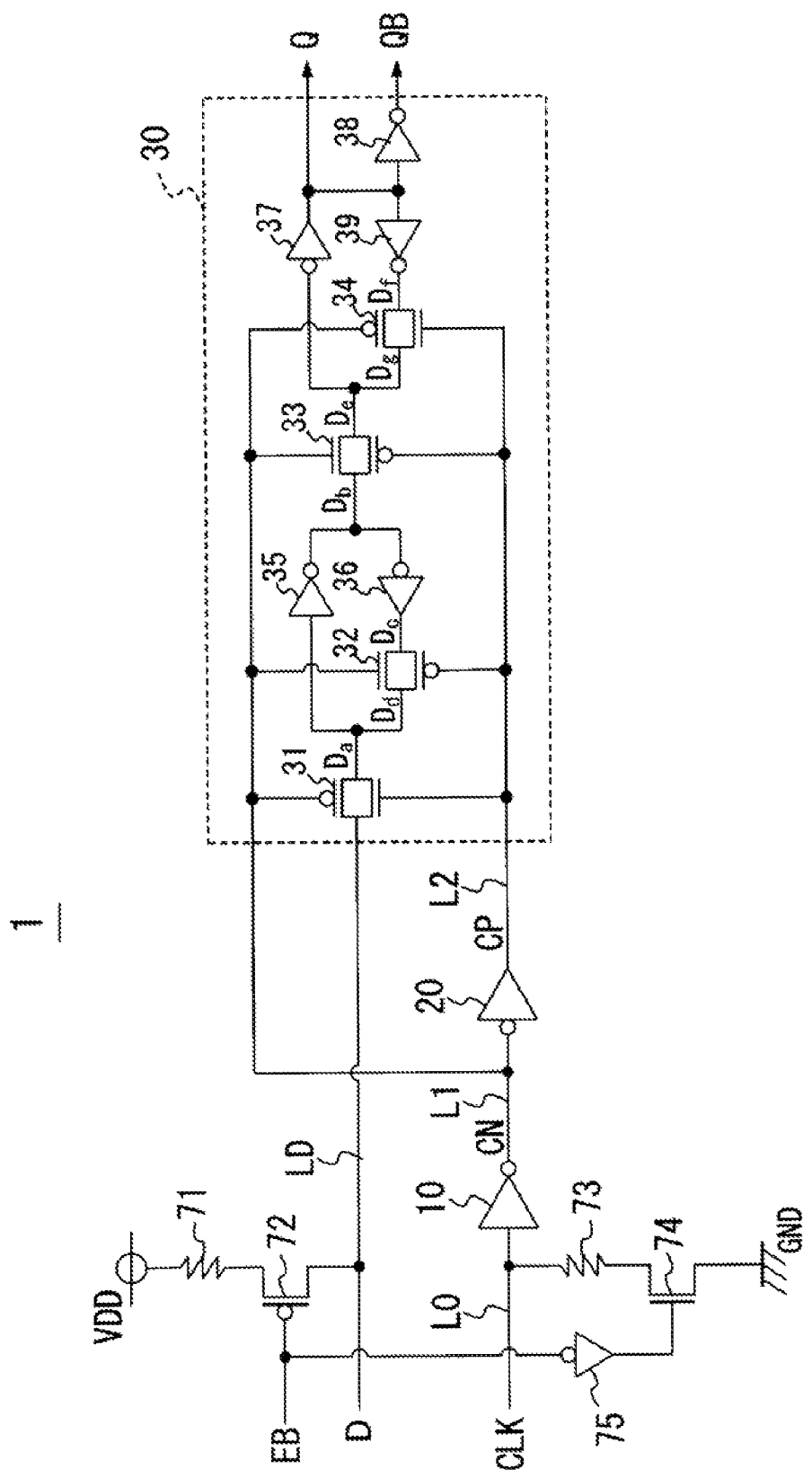
FIG. 8 is a circuit diagram showing a configuration of a clock synchronization circuit according to a fifth embodiment of the present invention.

FIG. 8 is a circuit diagram showing a configuration of the clock synchronization circuit 1 according to the fifth embodiment of the present invention.

As shown in FIG. 8, the clock synchronization circuit 1 includes a pull-up circuit formed of a resistor 71 and a p-channel MOS type transistor 72 and a pull-down circuit formed of a resistor 73, an n-channel MOS type transistor 74, and an inverter 75. Other components in the fifth embodiment are similar to those in the first embodiment. It should be noted that the clock inverter 10 and the clock inverter 20 shown in FIG. 8 may have either of the configurations shown in FIGS. 3 and 5.

As shown in FIG. 8, the power source voltage VDD is applied to a source terminal of the p-channel MOS type transistor 72 through the resistor 71, and a drain terminal of the p-channel MOS type transistor 72 is connected to a data input line LD, so that the input data bit D is transmitted to the DFF portion 30. Further, the disable signal EB is applied to a gate terminal of the p-channel MOS type transistor 72. As described above, the disable signal EB has the logic level "1" when the clock synchronization circuit 1 is in the normal operation state, and has the logic level "0" when the clock synchronization circuit 1 is in the non-operation state.

Further, the ground voltage GND is applied to a source terminal of the n-channel MOS type transistor 74, and a drain terminal of the n-channel MOS type transistor 74 is connected to a clock input line L0 through the resistor 73, so that the clock signal CLK is transmitted to the clock inverter 10. Further, the inverter 75 is configured to supply an inverted disable signal having the logic level inverted from that of the disable signal EB to a gate terminal of the n-channel MOS type transistor 74.

In the fifth embodiment, when the disable signal EB with the logic level "1" is supplied to the clock synchronization circuit 1, the p-channel MOS type transistor 72 and the n-channel MOS type transistor 74 become the off state. Accordingly, the clock synchronization circuit 1 becomes equivalent to the clock synchronization circuit 1 shown in FIG. 1. On the other hand, when the disable signal EB with the logic level "0" is supplied to the clock synchronization circuit 1, the p-channel MOS type transistor 72 and the n-channel MOS type transistor 74 become the on state. As a result, the pull-up circuit formed of the resistor 71 and the p-channel MOS type transistor 72 pulls up the data input line LD to the power source voltage VDD, and the pull-down circuit formed of the resistor 73, the re-channel MOS type transistor 74, and the inverter 75 pulls down the clock input line L0 to the ground voltage GND.

In the fifth embodiment, when the clock signal CLK has the logic level "0", and the input data bit D has the logic level "1", the leak current becomes minimum. Accordingly, in the clock synchronization circuit 1 shown in FIG. 8, when the clock synchronization circuit 1 is in the non-operation state, it is possible to set the data input line LD to the power source voltage VDD and the clock input line L0 to the ground voltage GND, respectively.

In the clock synchronization circuit 1 shown in FIGS. 1, 7, and 8, one clock buffer formed of the clock inverter 10 and the clock inverter 20 is disposed relative to one DFF portion 30 that stores the data per one bit. Alternatively, it may be configured such that the internal clock signal CN and the internal clock signal CP generated in one clock buffer formed of the clock inverter 10 and the clock inverter 20 are supplied each of a plurality of DFF portions.

In other words, as shown in FIGS. 1, 7, and 8, the clock synchronization circuit 1 formed of the DFF portion 30 and the clock buffer formed of the clock inverter 10 and the clock inverter 20 is defined as a microcell of one bit DFF. Alternatively, the DFF portion 30 and the clock buffer formed of the clock inverter 10 and the clock inverter 20 may be defined as a separate microcell.

In the embodiments described above, the DFF portion 30 is the flip-flop of the negative wedge trigger type. Alternatively, in order to attain the similar effect, the DFF portion 30 may be a flip-flop of the positive wedge trigger type.

The disclosure of Japanese Patent Application No. 2012-177365, filed on Aug. 9, 2012, is incorporated in the application by reference.

While the invention has been explained with reference to the specific embodiments of the invention, the explanation is illustrative and the invention is limited only by the appended claims.

What is claimed is:

1. A clock buffer comprising:
   an inverter core portion configured to generate an internal clock signal according to an input clock signal; and
   an electric current suppressing portion configured to reduce an amplitude of the internal clock signal to be smaller than that of the input clock signal,
   wherein said electric current suppressing portion includes a first transistor connected to a first power source line having a first potential, and a second transistor having a second potential, and
   said clock buffer further comprises a third transistor having a first terminal connected to the first power source line, a second terminal connected to a connection point between the first transistor and the inverter core portion, and a third terminal for receiving a control signal.

2. The clock buffer according to claim 1, wherein said inverter core portion is configured to generate the internal clock signal through alternately supplying an electric current to a clock line and drawing the electric current from the clock line, and
   said electric current suppressing portion is configured to adjust an amount of the electric current supplied to or drawn from the clock line with time.

3. A data synchronization circuit for capturing and outputting an input data according to an input clock signal, comprising:
   a clock buffer for generating an internal clock signal according to the input clock signal and transmitting the internal clock signal to a clock line; and
   a flip-flop circuit for capturing and outputting the input data according to the internal clock signal supplied through the clock line,
   wherein said clock buffer includes an inverter core portion and an electric current suppressing portion,
   said inverter core portion is configured to generate the internal clock signal according to the input clock signal,
   said electric current suppressing portion is configured to reduce an amplitude of the internal clock signal to be smaller than that of the input clock signal,
   wherein said electric current suppressing portion includes a first transistor connected to a first power source line having a first potential, and a second transistor having a second potential, and
   said clock buffer further comprises a third transistor having a first terminal connected to the first power source line, a second terminal connected to a connection point between the first transistor and the inverter core portion, and a third terminal for receiving a control signal.

* * * * *